(12) United States Patent
Mignot et al.

(10) Patent No.: US 11,784,120 B2
(45) Date of Patent: Oct. 10, 2023

(54) METAL VIA STRUCTURE

(71) Applicant: International Business Machines Corporation, Armonk, NY (US)

(72) Inventors: Yann Mignot, Slingerlands, NY (US); James J. Kelly, Schenectady, NY (US); Muthumanickam Sankarapandian, Niskayuna, NY (US); Yongan Xu, San Jose, CA (US); Hsueh-Chung Chen, Madison, WI (US); Daniel J. Vincent, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 79 days.

(21) Appl. No.: 17/480,824

(22) Filed: Sep. 21, 2021

(65) Prior Publication Data

US 2022/0005762 A1  Jan. 6, 2022

Related U.S. Application Data

(62) Division of application No. 16/431,381, filed on Jun. 4, 2019, now Pat. No. 11,152,298.

(51) Int. Cl.
| | | |
|---|---|---|
| *H01L 23/522* | (2006.01) | |
| *H01L 23/528* | (2006.01) | |
| *H01L 21/768* | (2006.01) | |
| *H01L 21/311* | (2006.01) | |
| *H01L 21/027* | (2006.01) | |

(52) U.S. Cl.
CPC .... *H01L 23/5226* (2013.01); *H01L 21/31116* (2013.01); *H01L 21/31144* (2013.01); *H01L 21/76802* (2013.01); *H01L 21/76877* (2013.01); *H01L 23/5283* (2013.01); *H01L 21/0276* (2013.01)

(58) Field of Classification Search
CPC .......... H01L 23/5226; H01L 21/76877; H01L 21/76802; H01L 21/31144; H01L 23/5283; H01L 21/31116; H01L 21/0276; H01L 21/76897; H01L 21/7685
See application file for complete search history.

(56) References Cited

U.S. PATENT DOCUMENTS

| | | | |
|---|---|---|---|
| 5,686,354 | A | 11/1997 | Avanzino et al. |
| 5,970,376 | A | 10/1999 | Chen |
| 6,867,073 | B1 | 3/2005 | Enquist |
| 7,620,926 | B1 | 11/2009 | Tuan |
| 8,114,769 | B1 | 2/2012 | Srivastava et al. |
| 9,385,078 | B1 | 7/2016 | Feurprier et al. |
| 9,653,303 | B2 | 5/2017 | Ooshima |

(Continued)

OTHER PUBLICATIONS

List of IBM Patents or Patent Applications Treated as Related.

*Primary Examiner* — Galina G Yushina
(74) *Attorney, Agent, or Firm* — Joseph P. Curcuru; Ryan, Mason & Lewis, LLP

(57) ABSTRACT

A semiconductor device includes a stack structure having at least first, second and third interconnect levels. Each interconnect level has a patterned metal conductor including a first metallic material. A via spans the second and third interconnect levels and electrically couples with the patterned metal conductor of the first interconnect level. At least a segment of the super via includes a second metallic material different from the first metallic material.

19 Claims, 13 Drawing Sheets

(56) References Cited

U.S. PATENT DOCUMENTS

| | | | |
|---|---|---|---|
| 9,786,557 B1 | 10/2017 | Chi et al. | |
| 9,805,972 B1* | 10/2017 | Zhang | H01L 21/288 |
| 9,805,977 B1 | 10/2017 | Sukumaran et al. | |
| 10,020,254 B1* | 7/2018 | Bao | H01L 23/53228 |
| 10,020,255 B1 | 7/2018 | Bao et al. | |
| 2007/0134917 A1 | 6/2007 | Li et al. | |
| 2016/0343652 A1 | 11/2016 | Karpman et al. | |
| 2018/0114752 A1* | 4/2018 | Briggs | H01L 23/528 |
| 2018/0130699 A1 | 5/2018 | Zhang et al. | |
| 2018/0269150 A1* | 9/2018 | Lin | H01L 23/53209 |
| 2019/0021176 A1* | 1/2019 | Law | H05K 3/4038 |

* cited by examiner

METAL VIA STRUCTURE

BACKGROUND

Illustrative embodiments generally relate to fabrication methods and resulting structures for semiconductor devices. More specifically, illustrative embodiments relate to the structure and formation of vias, including a super via and/or a skip via (SVIA), in back-end-of-line (BEOL) semiconductor processing.

Modern integrated circuits are becoming more complex and compact to meet technological demands. With continued efforts toward reduction of feature size, use of multiple-patterning and other advanced lithography techniques have been the subject of extensive research. The metal deposition process is also evolving to support continuous technology scaling. Generally, integrated circuits (ICs) include semiconductor devices formed as a configuration of circuits on a semiconductor substrate. A complex network of signal paths will normally be routed to connect the circuit elements distributed on the surface of the substrate. Efficient routing of these signals across the device requires formation of multilevel or multilayered conductive networks, which can be formed using schemes, such as, for example, single or dual damascene wiring structures.

SUMMARY

Embodiments of the present application provide techniques for formation of a via, including a super via or a skip via (SVIA), in a semiconductor component or device. In illustrative embodiments, the super via or SVIA is formed of a metallic material different than the material used in fabricating the metallic pattern layers of the interconnect levels of the semiconductor stack. The utilization of different materials provides flexibility in integrated circuit design and in addressing capacitance and high aspect ratio concerns.

In one illustrative embodiment, a semiconductor device comprises a stack structure having at least first, second and third interconnect levels. Each interconnect level has a patterned metal conductor including a first metallic material. A via spans the second and third interconnect levels and electrically couples with the patterned metal conductor of the first interconnect level. At least a segment of the via includes a second metallic material different from the first metallic material.

In another illustrative embodiment, a method for fabricating a semiconductor device comprises forming first and second interconnect levels on a substrate with the first and second interconnect levels having respective first and second dielectric layers and first and second patterned metal conductors comprising a first metallic material, depositing a third dielectric layer onto the second interconnect layer, forming a via opening extending through the third dielectric layer and the second dielectric layer and connecting with the first patterned metal conductor of the first interconnect level, and depositing a second metallic material different from the first metallic material into the via opening to form a via and wherein the via electrically couples with the patterned metal layer of the first patterned metal layer.

In yet another illustrative embodiment, a method for fabricating a semiconductor device comprises forming first and second interconnect levels, each of the first and second interconnect levels having a dielectric layer and a metal conductor comprising a first metallic material, depositing a third dielectric layer on the second interconnect level, forming a via opening extending from the third dielectric layer to the metal conductor of the first interconnect depositing a second metallic material within the via opening where the second metallic material is different from the first metallic material, and applying a metal conductor onto the third dielectric material where the metal conductor comprises the first metallic material and wherein at least a segment of the metal conductor is received within the via opening to form a via comprising the first metallic material and the second metallic material.

DETAILED DESCRIPTION

Figure 1:
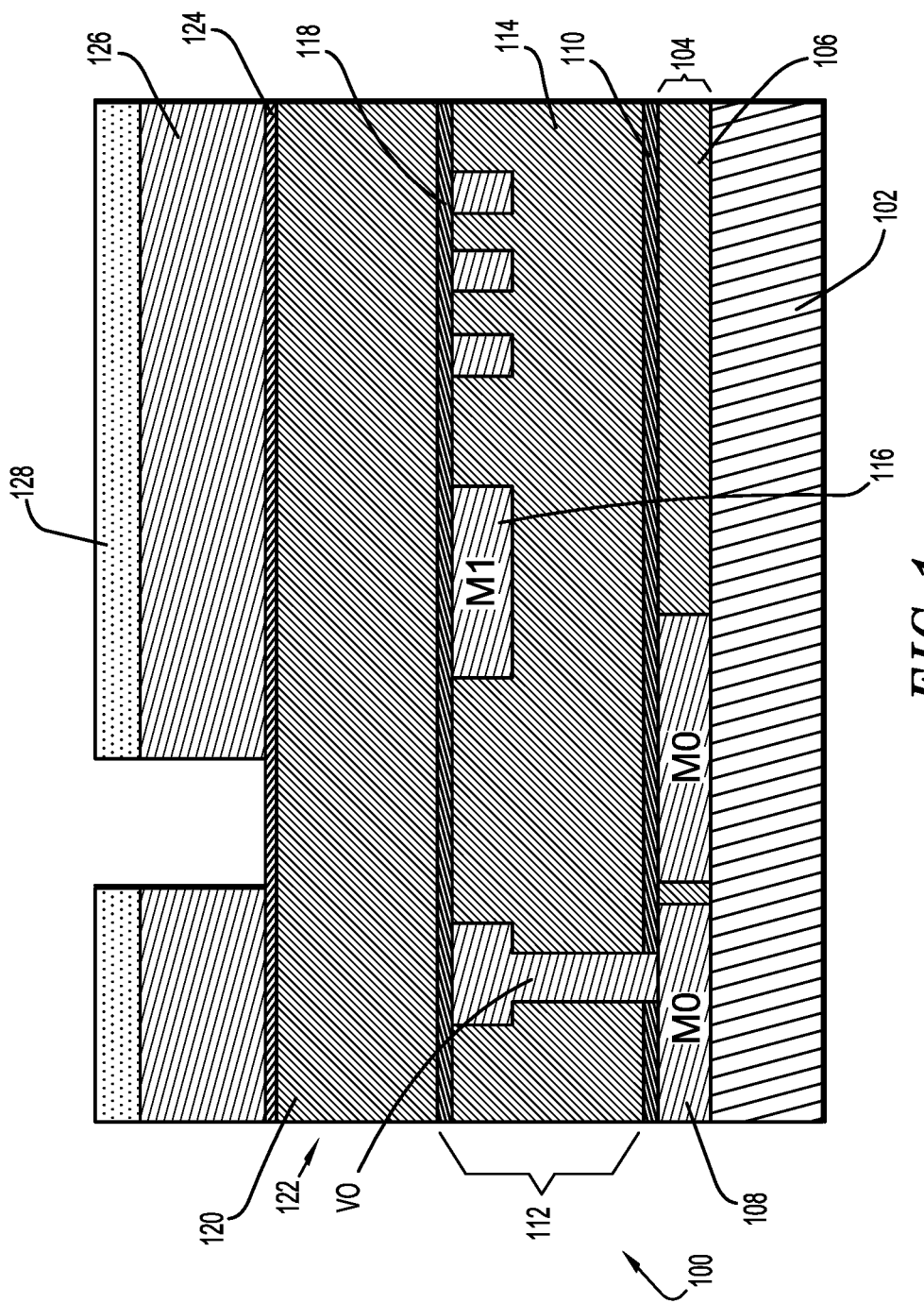
FIG. 1 is a cross-sectional view illustrating a semiconductor structure subsequent to an initial lithography and removal processes according to one or more embodiments of the invention.

The various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. The terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" can include both an indirect "connection" and a direct "connection." The terms "on" or "onto" with respect to placement of components relative to the semiconductor structure or stack is not to be interpreted as requiring direct contact of the components for it is possible one or more intermediate components, layers or coatings may be positioned between the select components unless otherwise specified. More specifically, positional relationships, unless specified otherwise, can be direct or indirect, and the present invention is not intended to be limiting in this respect.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Back-end-of-line (BEOL) processes are generally focused on forming metal interconnects between the different devices of the integrated circuit whereas the fabrication of the different devices that make up the integrated circuit are generally formed during the front end of line (FEOL) processing. A super via or skip via (SVIA) structure is generally defined as a vertical electrical connection (via) spanning two metal layers in the "z" direction without a landing pad on an intermediate metal layer, i.e., a double height via, that is formed during BEOL processing. The formation of super via structures is beneficial in that these types of structures can be used to minimize capacitance, which is highly desirable as integrated circuits scale down to smaller dimensions. Some of the challenges in forming the super vias structures are that a high aspect ratio etch recipe is required and that the filling of the resulting vias is through multiple materials present in a stack.

Methods for fabricating a super via or SVIA within a semiconductor structure or device 100 will now be discussed in further detail with reference to FIGS. 1 through 8, which schematically illustrate a semiconductor structure at various stages of fabrication. The semiconductor structure 100 includes a substrate 102, for example, a semiconductor wafer, which houses the various semiconductor devices and components that are formed in or on the active surface of the wafer to provide integrated circuitry for a target application as a result of FEOL (front-end-of-line) layer processing are not shown. For example, while the substrate 102 is schematically depicted for ease of illustration, it is to be understood that the substrate 102 comprises multiple layers including a semiconductor wafer substrate layer, a FEOL layer formed on the semiconductor wafer substrate, and a MOL layer formed on the FEOL layer. The semiconductor wafer substrate comprises one of different types of semiconductor wafer substrate structures and materials. For example, in one embodiment, the semiconductor wafer substrate can be a bulk semiconductor wafer substrate that is formed of silicon (Si) or germanium (Ge), or other types of semiconductor substrate materials which are commonly used in bulk semiconductor fabrication processes such as a silicon-germanium alloy, compound semiconductor materials (e.g. III-V), etc. In another embodiment, the semiconductor wafer substrate may comprise an SOI (silicon-on-insulator) substrate, GeOI (germanium-on-insulator) substrate, or other types of semiconductor-on-insulator substrates which comprise an insulating layer (e.g., oxide layer) disposed between a base substrate layer (e.g., silicon substrate) and the active semiconductor layer (e.g., Si, Ge, etc.) in which active circuit components are formed as part of the FEOL.

The FEOL layer comprises various semiconductor devices and components that are formed in or on an active surface of the semiconductor wafer substrate to provide integrated circuitry for a target application. For example, the FEOL layer comprises field-effect transistor (FET) devices (such as FinFET devices, vertical FET devices, planar FET devices, etc.), bipolar transistors, diodes, capacitors, inductors, resistors, isolation devices, etc., which are formed in or on the active surface of the semiconductor wafer substrate. In general, FEOL processes typically include preparing the semiconductor wafer substrate, forming isolation structures (e.g., shallow trench isolation), forming device wells, patterning gate structures, forming spacers, forming source/drain regions (e.g., via implantation), forming silicide contacts on the source/drain regions, forming stress liners, etc. The MOL layer comprises a PMD (pre-metal dielectric layer) and conductive contacts (e.g., source/drain contacts, gate contacts, etc.) that are formed in the PMD layer. The PMD layer is formed on the components and devices of the FEOL layer. The conductive contacts of the MOL layer provide electrical connections between the integrated circuitry of the FEOL layer and a first level of metallization of a BEOL structure that is formed over the FEOL/MOL layers.

In FIG. 1, the semiconductor structure or device 100 is illustrated in an early stage of manufacture. More specifically, the semiconductor structure 100 includes the aforedescribed semiconductor substrate 102, a first interconnect level 104 including a dielectric layer 106 and a patterned metal conductor or layer 108 lithography formed on the dielectric layer 106 using a process such as a damascene process. The patterned metal layer 108 within the first interconnect level 104 is typically referred to as metal-0 (M0). The first interconnect level 104 ranges from about 40 nanometers (nm) to about 100 nm.

The first interconnect level 104 has a planar top surface upon which is disposed a dielectric cap layer 110. The dielectric cap layer 110 serves to inhibit the diffusion of the metal, e.g., copper, and is typically fabricated from a nitride such as silicon carbon nitride, silicon nitride, or the like. In one illustrative embodiment, the dielectric cap layer is Nblock and has a thickness ranging from about 5 nm to 30 nm. A second interconnect level 112 is formed on the dielectric cap layer 110. The second interconnect level 112 includes a second dielectric layer 114 and a second patterned metal conductor or layer 116 also referred to as metal (M1) lithographically formed within the second dielectric layer 114. In the illustrative embodiment of FIG. 1, a normal height via (V0) vertically extends and electrically couples the patterned metal layers M0 and M1. The second interconnect level 112 ranges from about 60 nm to about 200 nm. A second dielectric cap layer 118 is disposed on the second dielectric layer 114 and a third dielectric layer 120 as a component of a third interconnect level 122 is disposed on the second dielectric cap layer 118. The second dielectric cap layer 118 may be formed from Nblock having a thickness or height of 5 nm to 30 nm. The third interconnect level 122 ranges from about 60 nm to about 200 nm.

The first, second and third dielectric layers 106, 114, 120 comprise any suitable layer of ultra "low k" insulating/dielectric material such as silicon oxide (e.g. SiO2), silicon nitride (SiN), silanol (SiOH), hydrogenated silicon nitride (SiNH), silicon carbide (SiC), silicon carbon nitride (SiCN), hydrogenated silicon carbide (SiCH), fluorine-doped silicon oxide (SiOF), carbon doped oxide (CDO), SiOC films or SiOCH low-k films and other similar types of insulating/dielectric materials or porous dielectrics or an ULK (ultra-low-k) dielectric material (with k less than about 2.5 etc.), wherein "k" denotes a relative dielectric constant. The dielectric materials may be deposited using known deposition techniques, such as, for example, ALD (atomic layer deposition), CVD (chemical vapor deposition) PECVD (plasma-enhanced CVD), or PVD (physical vapor deposition), or spin-on deposition, or other deposition techniques that are suitable to form low-k dielectric layers. As an option, an underlayer or top cap layer (e.g., a "ULK" cap) 124 may be deposited on the third dielectric layer 120.

In addition, in FIG. 1, a multilayer patterning scheme is shown as a process step in forming the super via or SVIA opening. An illustrative patterning scheme includes forming a trilayer of organic planarizing layer (OPL) 126, silicon anti reflective coating (SiARC) 128, and a photoresist (not shown) onto at least the third dielectric layer 120 and/or the top cap layer 124 (if present) where the opening for the super via is desired, exposing the photoresist to a pattern of activating radiation, and then developing the exposed photoresist with a resist developer to provide a patterned photoresist. At least one etch process is employed to transfer the pattern from the patterned photoresist into at least the third dielectric layer 120. The result of the etching process is the super via opening which will eventually be filled during metallization as will be discussed hereinbelow.

The OPL 126 of the trilayer stack is deposited from a solution, e.g., by deposition spin coating, and is baked at high temperatures. The OPL 126 is self-leveling and achieves planarization over the surface topography without the use of etching, chemical mechanical polishing, or other conventional planarization techniques. The OPL 126 may have a thickness ranging from about 60 nm to about 200 nm. The antireflective coating of SiARC may range from about 10 to 80 nm in thickness. Other anti-reflection coatings are also contemplated. The SiARC is etched using known dry etch chemistries such a tetrafluoromethane ($CF_4$), hexafluorocyclobutene ($C_4F_6$), or any combination of fluorocarbon (CxFy) gas with additional mixing gas such as $N_2$ or Ar. OPL 126 is etched with $CO/CO_2$, $N_2/H_2$, $SO_2$, HBr, $O_2$ or any combination. The photoresist layer (not shown) may be any conventional organic photoresist material such as a 193 nm photoresist that is located atop the antireflective coating SiARC 128. Illustrative examples of 193 nm photoresists include methacrylates. Other types of organic photoresists such as, for example, polyesters can also be employed.

Figure 2:
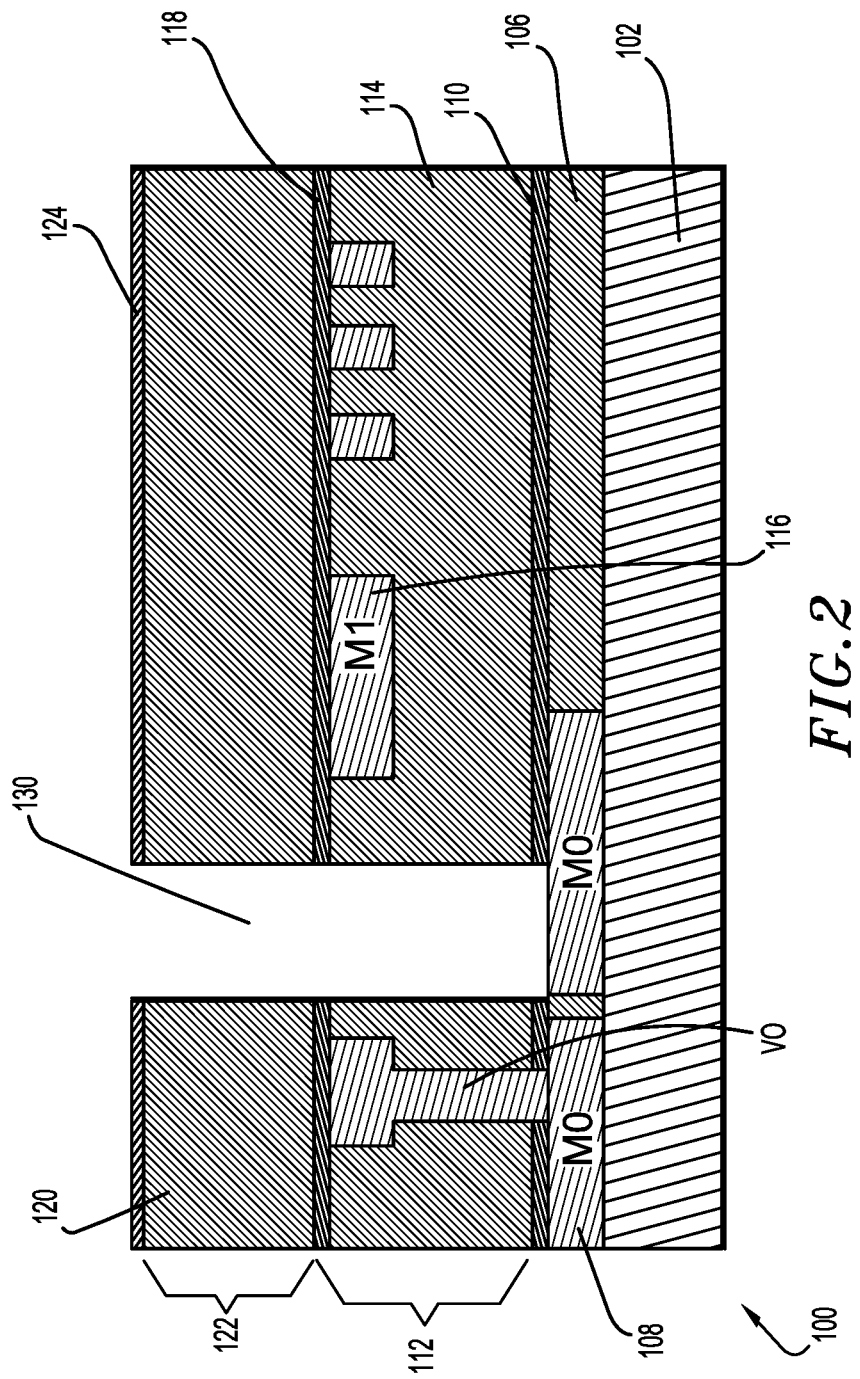
FIG. 2 is a cross-sectional view illustrating the semiconductor structure of FIG. 1 subsequent to an etching process to form a super via opening according to one or more illustrative embodiments.

Referring now to FIG. 2, via the photoresist pattern, the super via opening or skip via (SVIA) opening 130 is etched through the third and second interconnect levels 122, 112, and the second and first dielectric cap layers 118, 110 to extend and communicate with the first metal layer M0. Any suitable etching process may be utilized including a dry etch process such as RIE (reactive ion etching or plasma etching). Moreover, as shown, the super via opening 130 spans the second and third interconnect levels 112, This RIE sequence is required to etch two dielectric layers 114, 120 and the three cap layers 110, 118, 124. The first sequence is to open the top cap layer 124 with a physical etch comprising a $CF_4$/Ar chemistry. It will partially or completely etch the top SiARC 128. Once the top cap layer 124 is open, a chemistry change is needed to reduce the ULK lateral erosion or damage by addition of some polymerizing gas such as $CH_2F_2$. The same process will be followed for the second dielectric layer 114. Etching the dielectric cap layers 118, 110 will require another chemistry change with a $CH_3F$ composition. Once the super via has been opened thereby forming the super via opening 130, the OPL 126 is removed with a $CO/CO_2$ chemistry.

Figure 3:
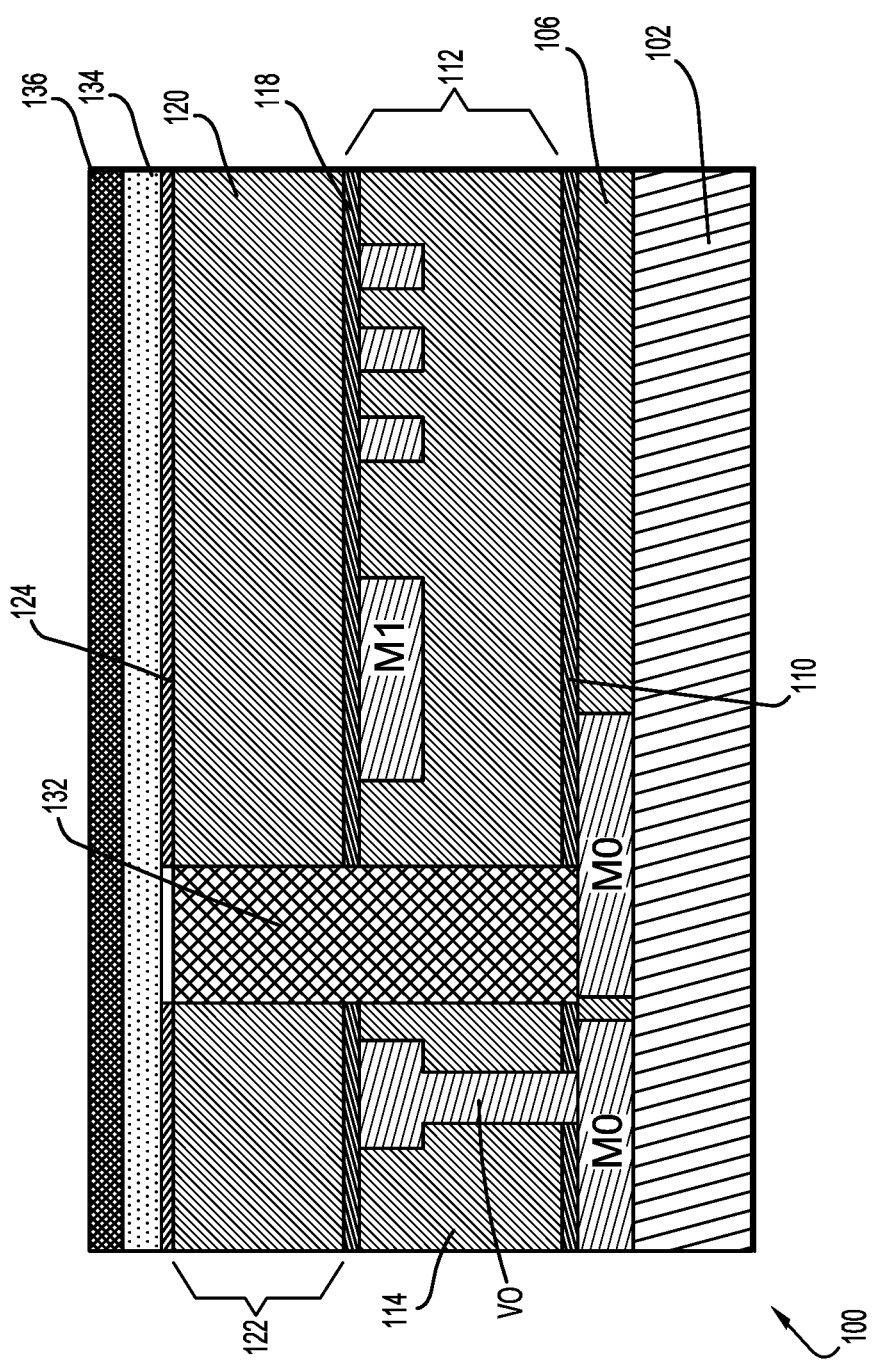
FIG. 3 is a cross-sectional view illustrating the semiconductor structure of FIG. 2 subsequent to depositing a metallic material into the super via opening to create the super via according to one or more illustrative embodiments.

With reference to FIG. 3, the super via opening 130 is filled with a conductive material, for example, a conductive metallic material to form a super via or skip via (SVIA) 132. Any suitable conductive metal may be utilized including, but not limited to cobalt, titanium, copper, aluminum (Al), tungsten (W), iridium (In), ruthenium (Ru), or alloys thereof. The metallic material forming the super via 132 is different from the metal forming the patterned metal layers M0, M1. In one illustrative embodiment the conductive material of the super via 132 includes cobalt.

As an option, a seed layer may first be deposited into the super via opening 130 prior to depositing the metallic material. The function of the seed layer is to provide a base upon which the super via material can be deposited and as well to prevent metal diffusion into the dielectric. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of MID, the seed layer can be deposited by reactive or non-reactive sputtering from a single alloy target, or from multiple targets, by ionized sputtering.

Following formation of the super via 132, the super via 132 is subjected to a planarization process to remove any material excess or overburden such that a top surface of the metallic material of the super via 132 is substantially coplanar to the low k third dielectric layer 120. The surface can be planarized using an electropolishing process. In an electropolishing process, small amounts of the metal material are etched from the metal by electro-etch or electrochemical etching. In another embodiment, the planar surface is formed by chemical-mechanical-polishing (CMP), using a non-selective slurry: composition. The slurry composition contains a silica abrasive material, which removes the different metal layers at substantially the same rate. Alternatively, a planar surface can be formed by a non-selective plasma etching process. With continued reference to FIG. 3, a hard mask including a titanium nitride (TiN) layer 134 and tetraethyl orthosilicate (TEOS) layer 136 are sequentially deposited onto the planarized surface of the layer of third dielectric layer 120 and/or the top cap layer 124.

Figure 4:
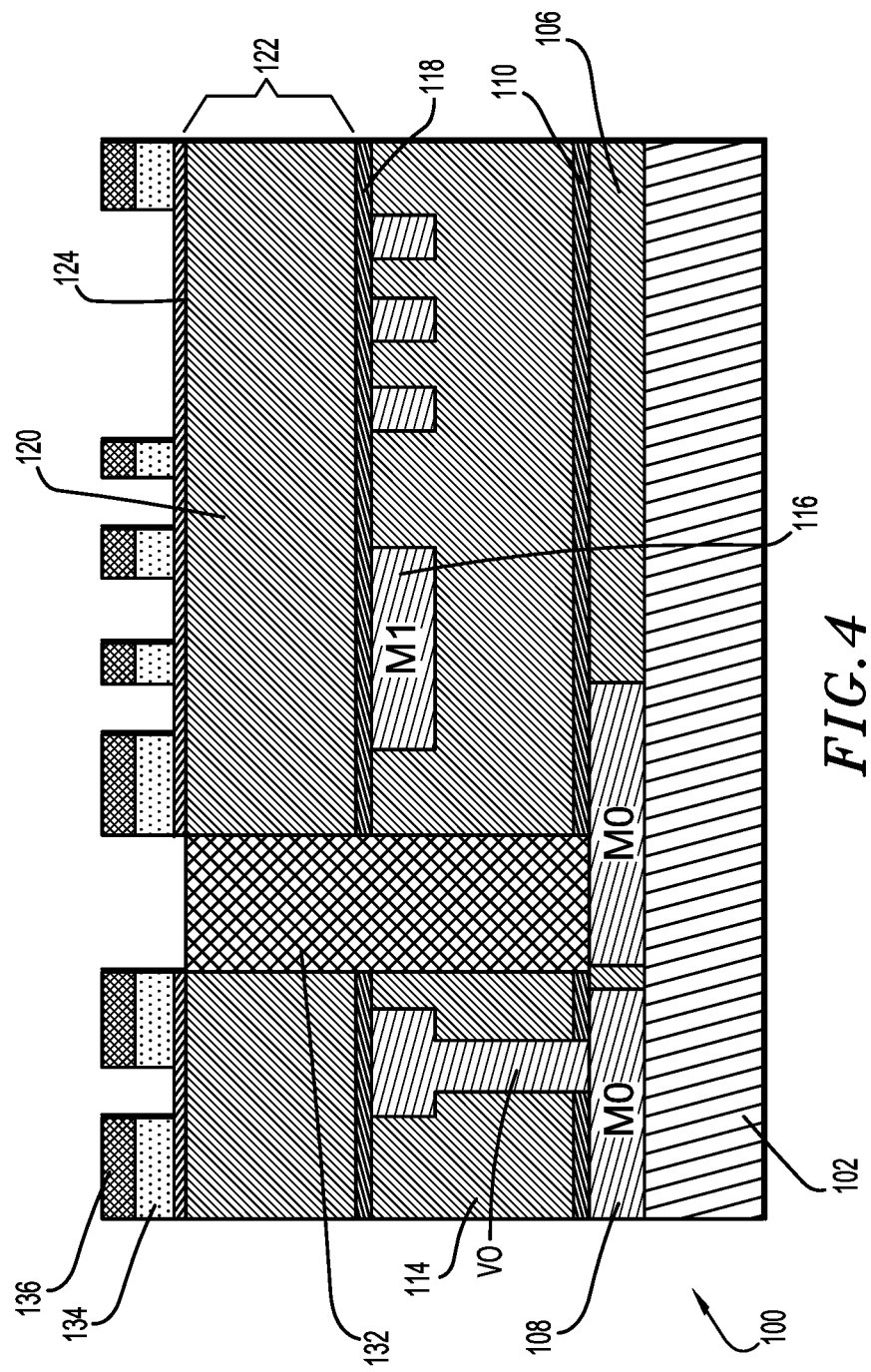
FIG. 4 is a cross-sectional view illustrating the semiconductor structure of FIG. 3 subsequent to a hard mask over etch process according to one or more illustrative embodiments.

With reference to FIG. 4, the titanium nitride layer 134 and the TEOS layer 136 are then lithographically patterned to form openings, which generally correspond to the underlying patterned metal layer M1 and the underlying patterned metal layer M0. A multilayer patterning scheme such as the trilayer scheme described above can be used to form the openings. General etch chemistries are $Cl_2/CH_4$/Ar for TiN and CxFy for TEOS.

Figure 5:
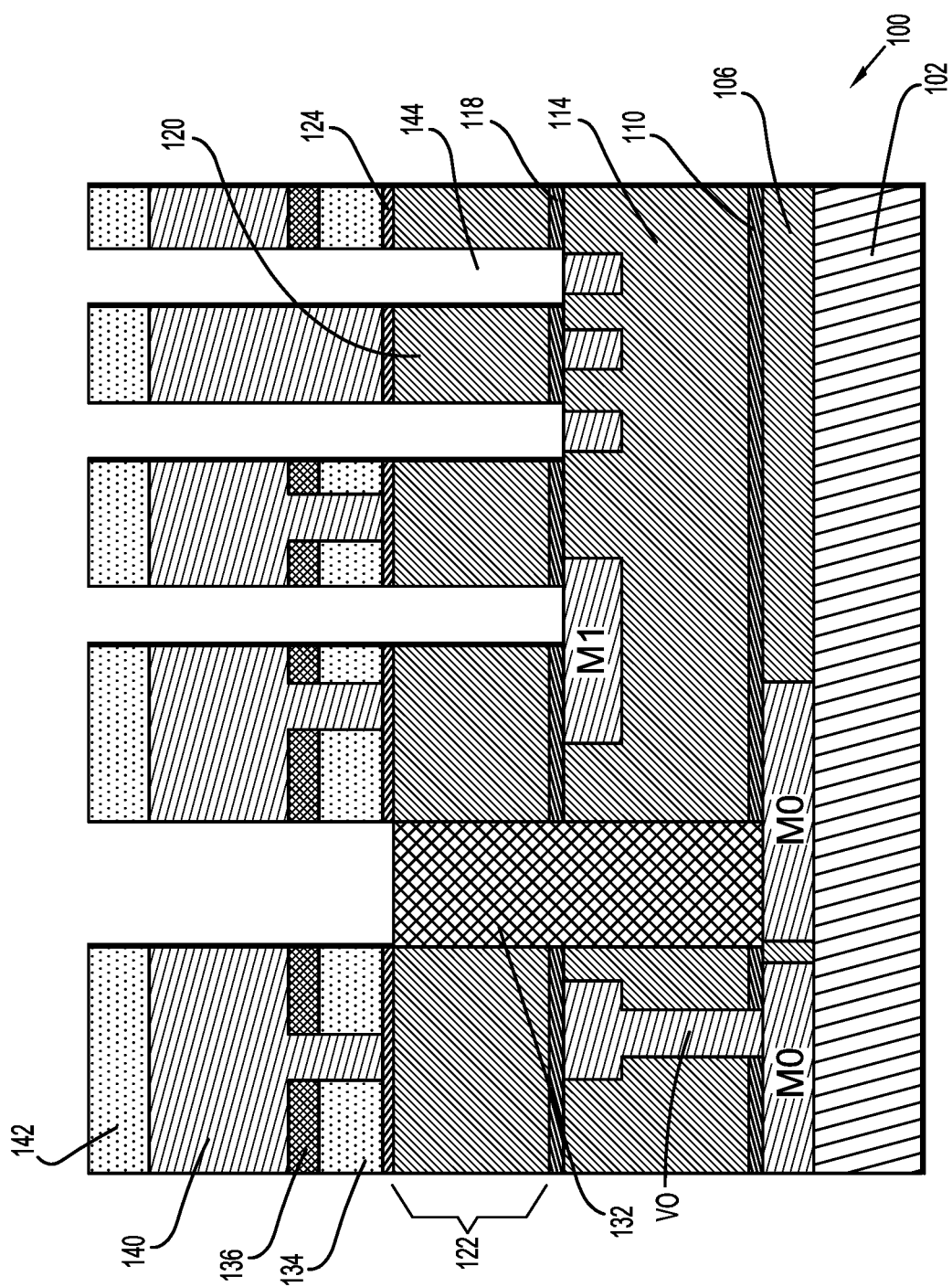
FIG. 5 is a cross-sectional view illustrating the semiconductor structure of FIG. 4 subsequent to lithography and etching processes according to one or more illustrative embodiments.

With reference to FIG. 5, another layer of OPL 140 and SiARC 142 respectively along with a photoresist layer (not shown) are deposited onto the protective TEOS layer 136. The OPL 140 material fills the openings within the TiN and TEOS layers 134, 136. The photoresist is exposed to a pattern of activating radiation, and then the exposed photoresist is developed with a resist developer to provide a patterned photoresist. The photoresist is patterned to form vias openings in the third dielectric layer 120 using suitable etching methods. The etching process can be a dry etch (e.g., reactive ion etching or plasma etching). A reactive ion etching process can be used to form the various via structures stopping on the second cap layer 118. As shown three via openings 144 are formed to communicate with metal layer M1.

Figure 6:
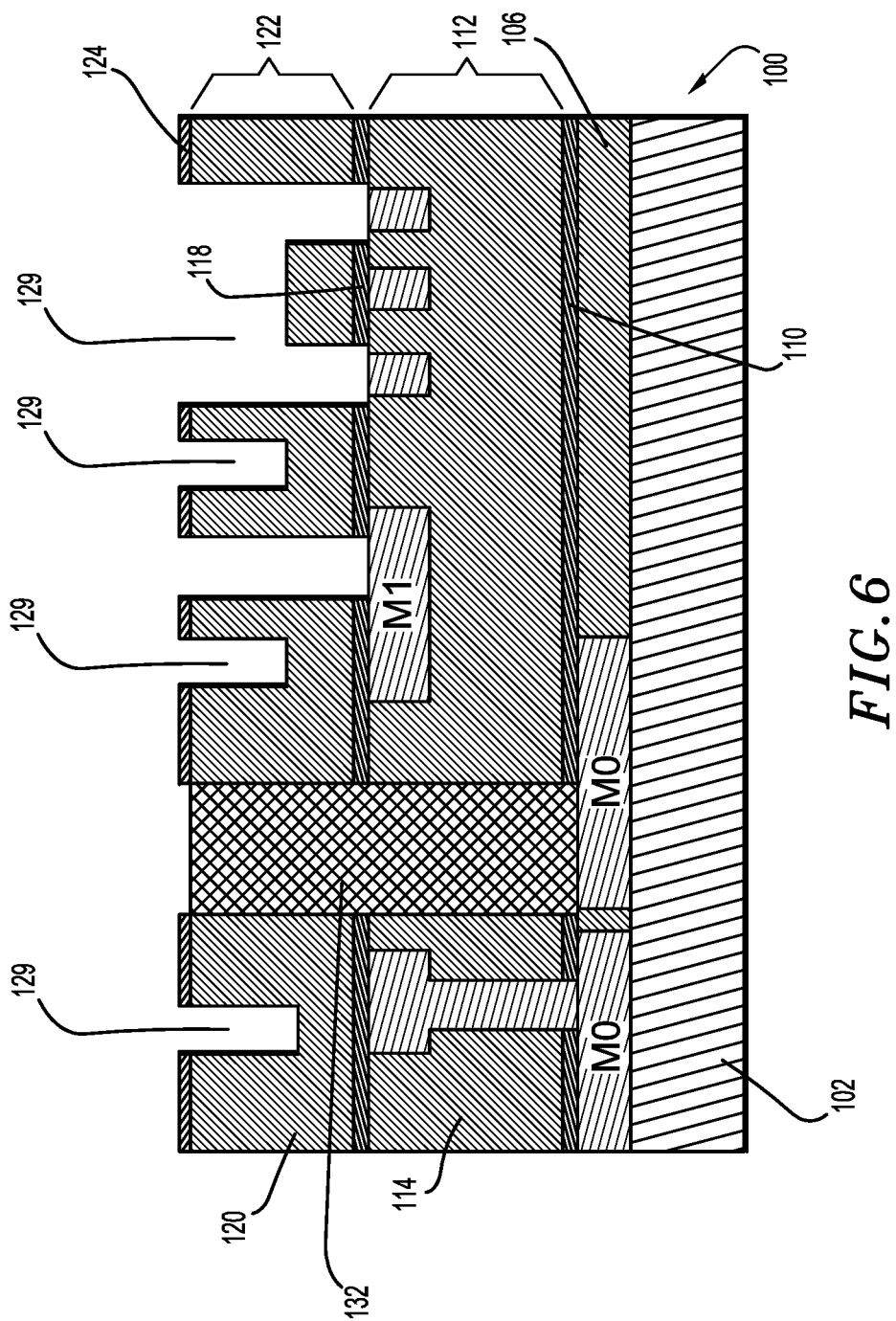
FIG. 6 is a cross-sectional view illustrating the semiconductor structure of FIG. 5 subsequent to additional removal processes according to one or more illustrative embodiments.

Referring now to FIG. 6, the OPL 140, SiARC 142, TiN 134 and TEOS 136 layers are removed via an ash etching and/or stripping process and trenches opened in the third dielectric layer 120 forming openings 129. The etching material can be an $N_2/H_2$, or $CO/CO_2$ ash or a nitrogen or hydrogen-based chemistry including, for example, nitrogen gas or hydrogen gas, or a combination thereof.

In embodiments, prior to metallization, a conformal layer of liner material may be deposited over the patterned surface of the third dielectric layer 120 to line the sidewall and bottom surfaces of the etched openings. The liner material serves as a diffusion barrier layer which can include materials that are commonly used as diffusion barrier layers for copper interconnects including, but not limited to, titanium (Ti), tantalum (Ta), titanium nitride (TiN), tantalum nitride (TaN), cobalt (Co), etc. In addition, the liner layers may comprise a thin seed layer to serve as a wetting or adhesion layer for the deposition of the metallic material which fills the etched openings to form the third metal layer M2 structures. A chemical-mechanical planarizing (CMP) is then performed to remove overburden portions of the liner layer, seed layer, and metallic layer down to the third dielectric layer 120.

Figure 7:
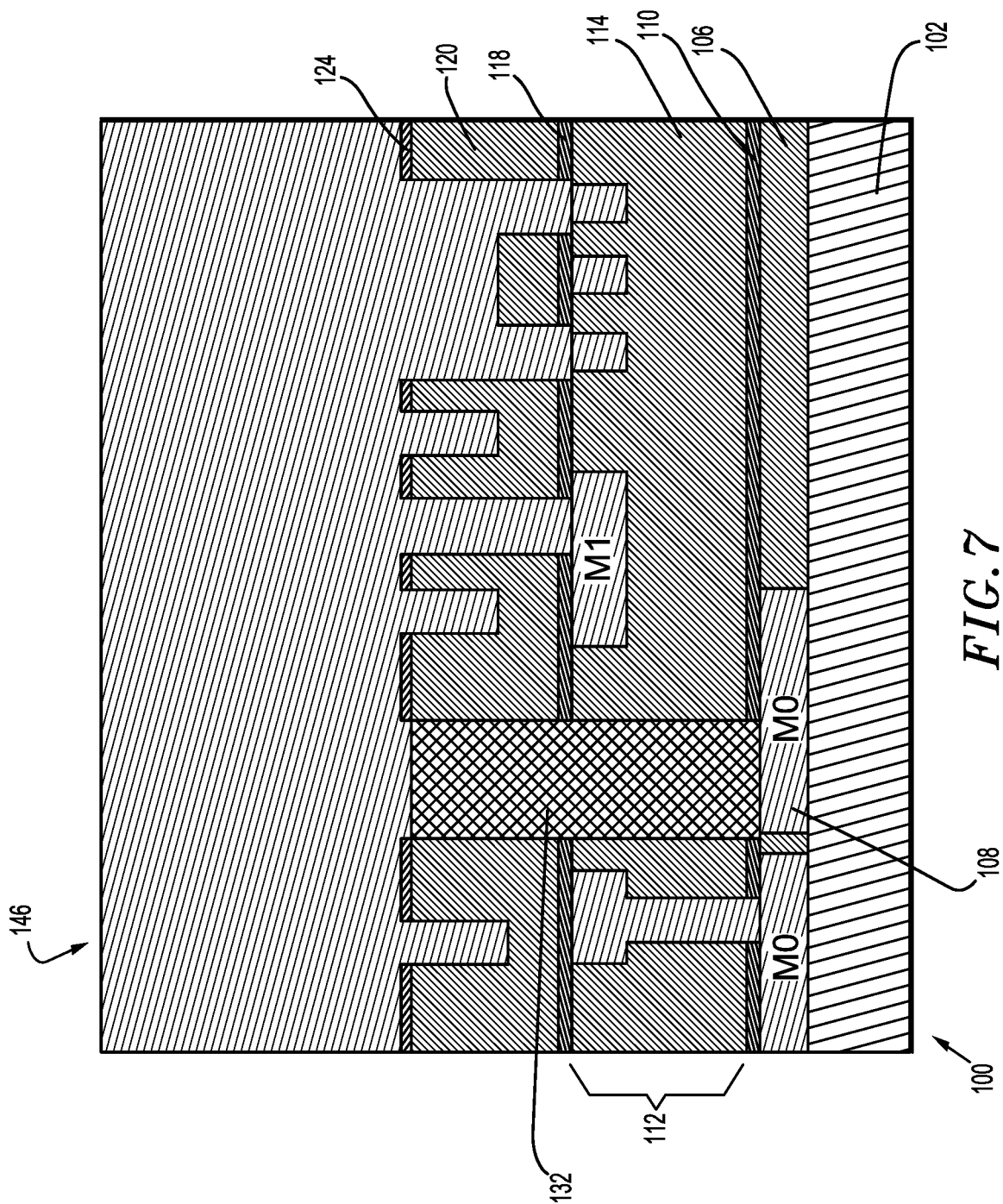
FIG. 7 is a cross-sectional view illustrating the semiconductor structure of FIG. 6 subsequent to a metallization process according to one or more illustrative embodiments.

With reference to FIG. 7, a metallization layer 146 is deposited onto the semiconductor structure 100 using any suitable wet or dry deposition method. The metal selected for this metallization procedure is different from the metal forming the super via 132 and includes, but is not limited to, cobalt, titanium, copper, aluminum (Al), tungsten (W), iridium (Ir), ruthenium (Ru), or alloys thereof. The metal used in the metallization process may be the same metal forming the first and second conductive layers. The metallization layer can be formed by CVD, sputtering, electrochemical deposition or like processes. For example, the deposition of copper can proceed by electrochemical deposition such as electroplating or electroless plating.

Figure 8:
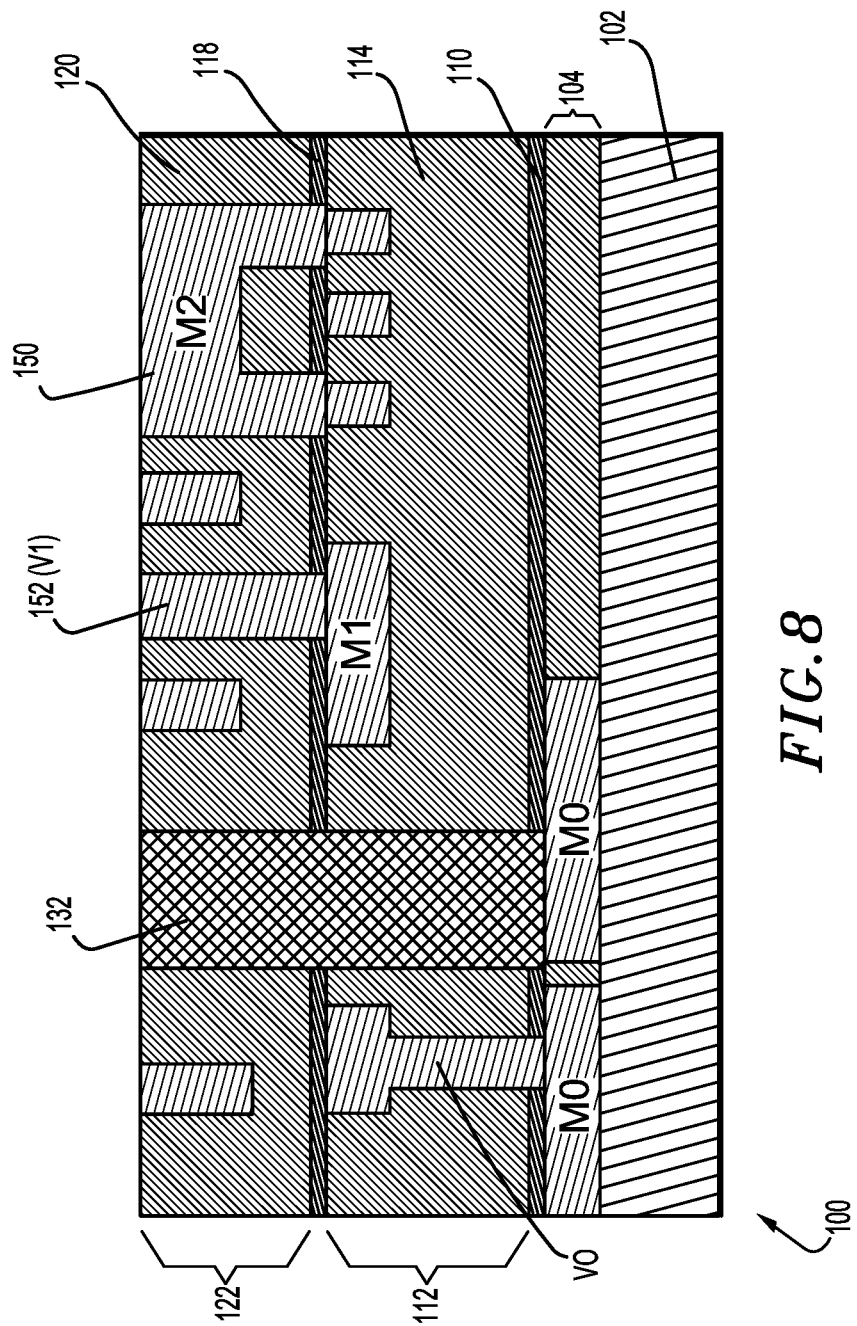
FIG. 8 is a cross-sectional view illustrating the semiconductor structure of FIG. 7 subsequent to a planarization process according to one or more illustrative embodiments.

With reference to FIG. 8, following formation of the metal layer, the metallization layer 146 is subjected to a planarization process to remove any metal overburden such that a top surface of the metal, for example, copper, is substantially coplanar to the low k dielectric layer to form the third conductive layer 150, also referred to a metal layer M2. For example, the surface can be planarized using an electropolishing process. In an electropolishing process, small amounts of metal, for example, copper are etched by electro etch or electrochemical etching to provide a copper interconnect having a top copper surface generally coplanar to the top surface of the third dielectric layer 120. Such a structure is often referred to as a recessed structure. In another embodiment, the planar surface is formed by chemical-mechanical-polishing (CMP), using a non-selective slurry composition. The slurry composition contains a silica abrasive material, which removes the different metal layers at substantially the same rate.

Thus, in accordance with the illustrative embodiment of FIGS. 1-8, a monolithic super via or skip via (SVIA) 132 is formed spanning the second and third interconnect levels 112, 122 to electrically couple components of the metal layers M0, M2. The super via 132 terminates on the underlying metal layer M0 and is at a double height spanning two interconnect levels 112, 122 relative to the other via V0 which spans the height of the second interconnect level 112, and via 152-V1, which spans the height of the third interconnect level 122. In the embodiment shown, the super via or skip via (SVIA) 132 is formed where the second metal layer M1 is isolated from the super via 132. In other embodiments, the formed via may connect all three metal layers M0, M1, M2.

Thus, in accordance with an illustrative embodiment of the present invention, a super via or skip via (SVIA) 132 is fabricated from a different metallic material than the other metallization levels and the other vias. The difference in material provides flexibility in design parameters such as footprint reduction of the semiconductor and modulating the resistance/capacitance ratio (R/C) by introduction of an alternative metallization and skipping an interconnect level with optimized aspect ratio.

Figure 9:
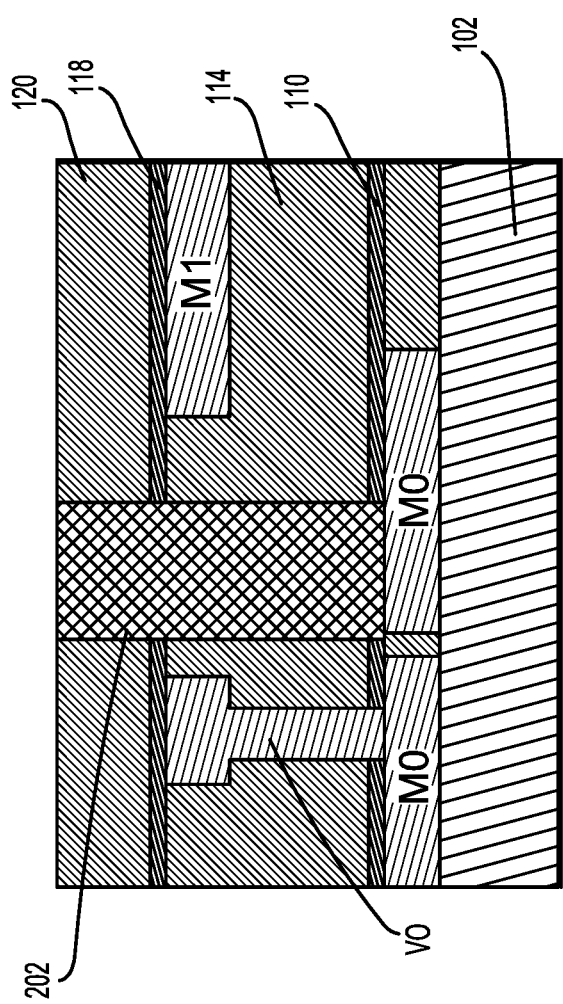
FIG. 9 is a cross-sectional view of another illustrative embodiment of the semiconductor structure according to one or more illustrative embodiments.
Figure 10:
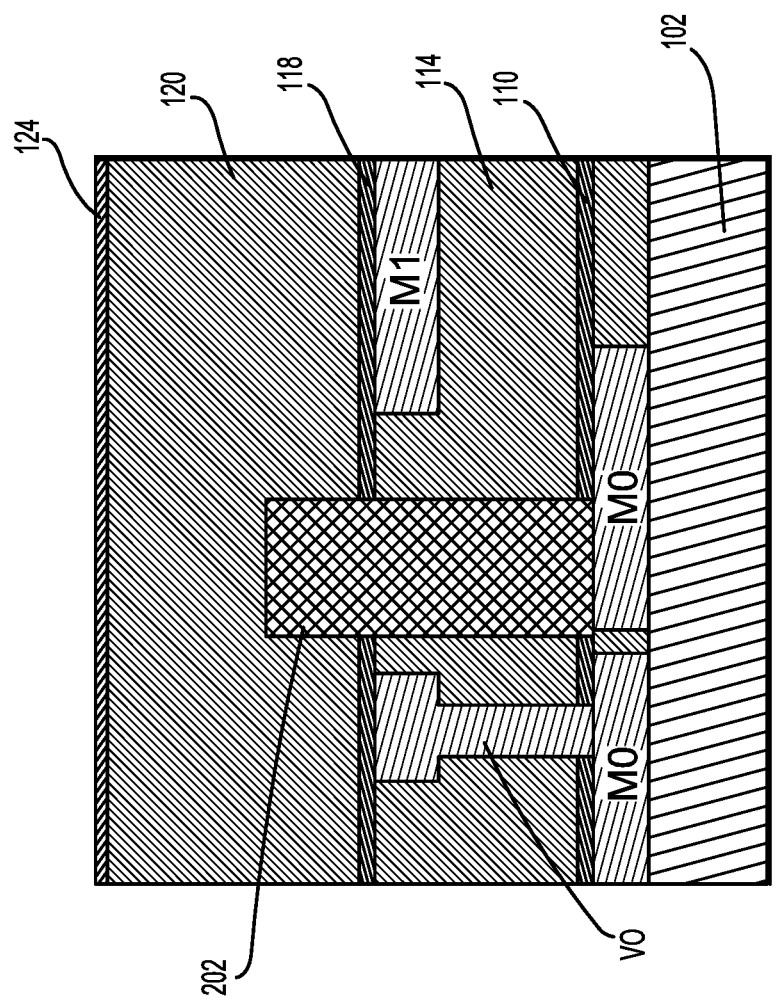
FIG. 10 is a cross-sectional view illustrating application of additional overburden dielectric material onto the semiconductor structure of FIG. 9 according to one or more illustrative embodiments.

FIGS. 9-13 depict another illustrative embodiment incorporating a super via fabricated from a different conductive metal than the metallization layer. This embodiment is substantially similar to the embodiment of FIGS. 1-8. In particular, the super via 202 opening is formed in the manner discussed hereinabove in connection with FIGS. 1-2. The second metallic material is deposited in the super via opening to form at least a portion of the super via 202. The metallic super via 202 is subjected to an CMP process such that the upper surface portion of the super via 202 is recessed to the upper surface of the third dielectric layer 120 to form a planar surface as depicted in FIG. 9. Thereafter, with reference to FIG. 10, an additional or oxide material is deposited on the surface of the third dielectric layer 120 and super via portion 202 to form an over burden of oxide material of the third dielectric layer 120. The thickness of the additional ULK material is determined based on the device performance and generally is between about 10 nm to about 40 nm. A CMP step may be required to achieve the optimum height and planarization of the surface. A trilayer of organic planarizing layer (OPL) 134 (not shown), silicon anti reflective coating (SiARC) 128 (not shown), and a photoresist (not shown) are then deposited onto at least the third dielectric layer 120 and/or the top cap layer 124 (if present) as discussed hereinabove in connection with the discussion of FIGS. 3-4.

Figure 11:
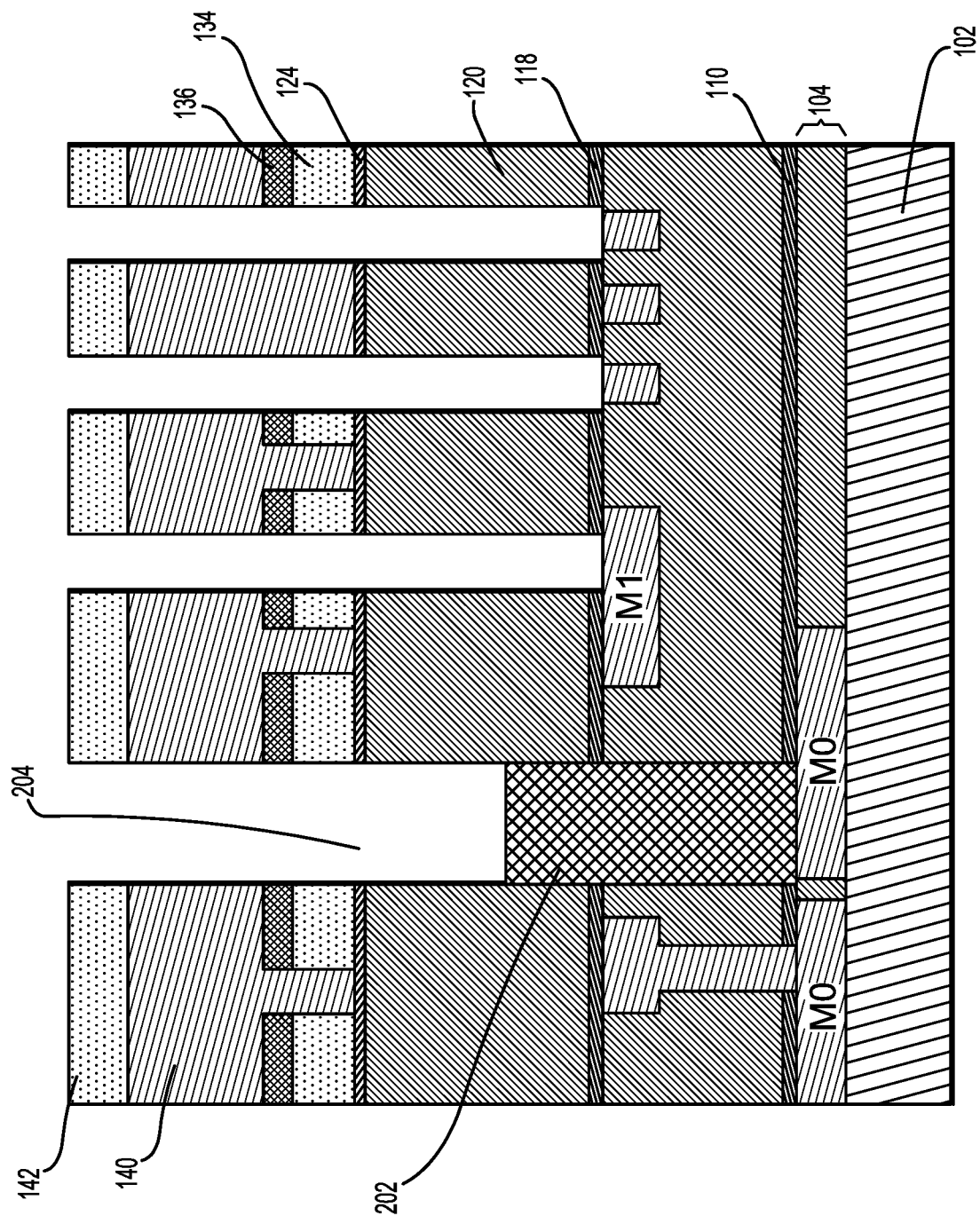
FIG. 11 is a cross-sectional view illustrating the semiconductor structure of FIG. 10 subsequent to lithography and etching processes according to one or more illustrative embodiments.
Figure 12:
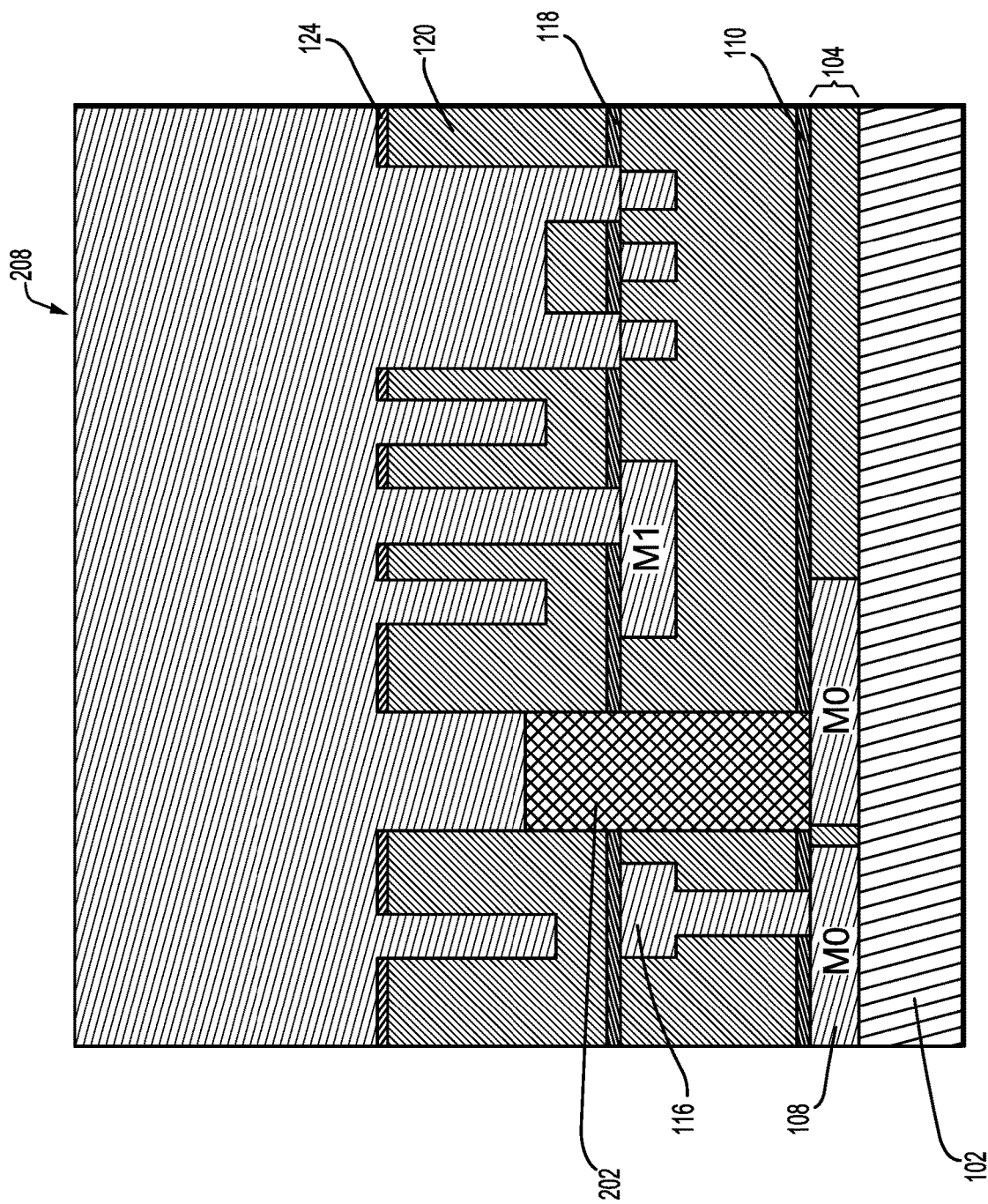
FIG. 12 is a cross-sectional view illustrating the semiconductor structure of FIG. 11 subsequent to a metallization process according to one or more illustrative embodiments.
Figure 13:
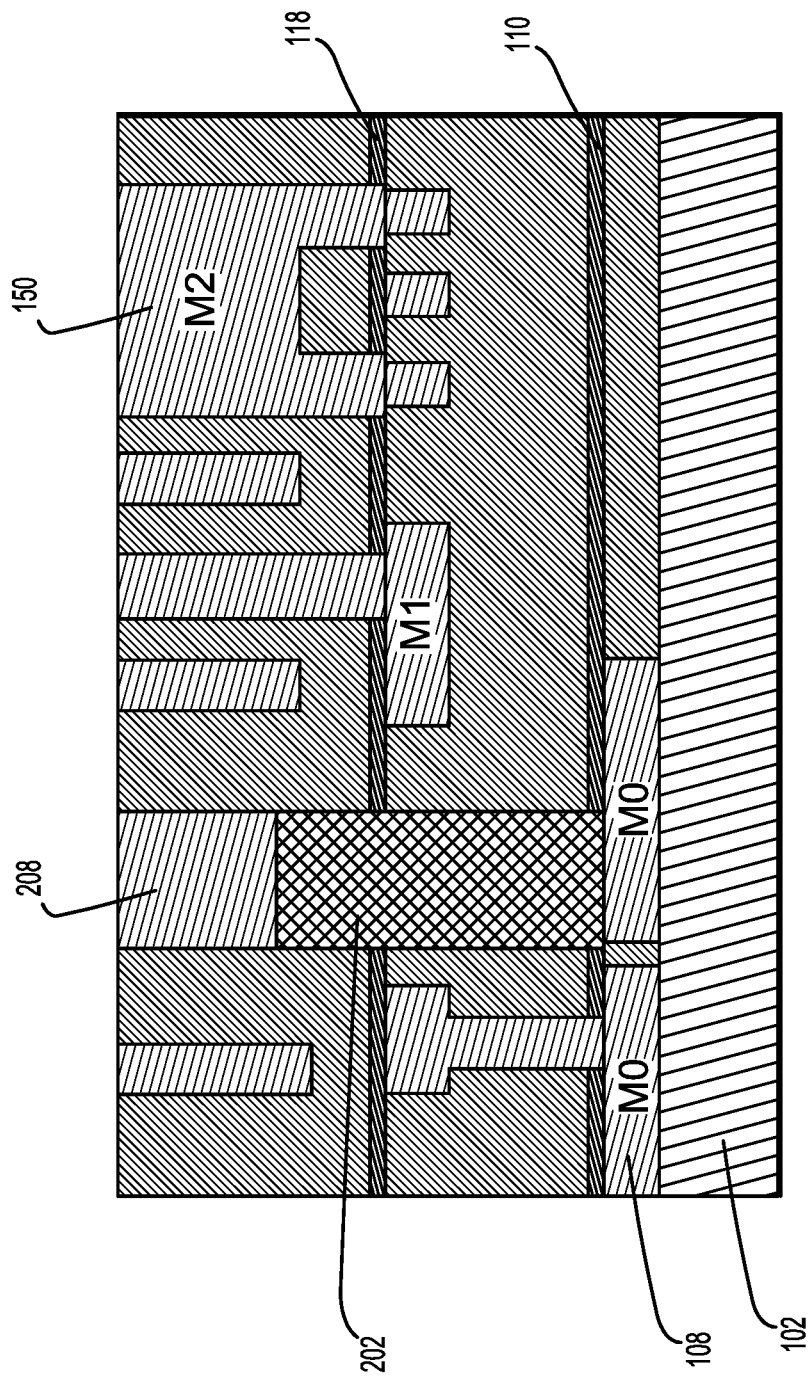
FIG. 13 is a cross-sectional view illustrating the semiconductor structure of FIG. 12 subsequent to a planarization process according to one or more illustrative embodiments.

The same process utilized in the embodiments of FIGS. 1-8 is followed to create the trench openings and vias in the third dielectric layer 120 (FIG. 5), and reference is made to the foregoing description for a discussion of same as depicted in FIG. 11. A trench 204 is formed within the third dielectric material in alignment with the super via 202. With reference to FIG. 12, a metal coating 208 or metallization is applied to the third dielectric layer 120 to fill the vias and trenches. The metal coating is a different metallic material from the super via 202, and, in embodiments, may be the same material used in forming the first and second metallic conductive layers. With reference to FIG. 13, the metal coating is subject to a planarization process as described hereinabove.

Thus, in this illustrative embodiment, the super via 202 and the deposited metal coating 208 of the third patterned coating or third conductive layer 150 disposed within the trench 204 create a super via 202/208 electrically coupling the first metal layer M0 and the third metal layer M2 of the semiconductor structure 100. The difference in materials of the super via 202/208 provides flexibility in design parameters such as footprint reduction of the semiconductor and as ell modulating the resistance/capacitance ratio (R/C) by introduction an alternative metallization and skipping an interconnect level with optimized aspect ratio. Also, this embodiment will provide more flexibility in process control as the fixed height of the super via can be increased a little bit with a controlled dielectric overburden.

It is envisioned that the above fabrication techniques may be applicable to form a single via which directly connects adjacent metal patterned layers within the semiconductor structure 100. More specifically, the single via may be fabricated from a different material than the metal layers to which it connects. Alternatively, or additionally, the single via may be fabricated from two different metallic materials.

It is envisioned that the semiconductor components may be a part of a semiconductor and also a component of an integrated circuit. The resulting integrated circuit incorporating the semiconductor components can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuits, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
   a stack structure including at least a first interconnect level, a second interconnect level and a third interconnect level, each interconnect level having a patterned metal conductor;
   a via spanning the second interconnect level and the third interconnect level and electrically coupled with the patterned metal conductor of the first interconnect level; and
   first and second additional vias extending between and each electrically coupled with a respective part of the patterned metal conductor of the second interconnect level and the patterned metal conductor of the third interconnect level;

wherein the via comprises a first via segment within the second interconnect level and a portion of the third interconnect level and a second via segment within a remaining portion of the third interconnect level, the first via segment comprising a first metallic material and the second via segment comprising a second metallic material different from the first metallic material;

wherein the via is a monolithically formed via; and wherein a top surface of the first via segment within the portion of the third interconnect level is above a bottom surface of the patterned metal conductor of the third interconnect level.

2. The semiconductor device of claim 1, wherein the patterned metal conductors of at least one of the first, second and third interconnect levels comprises the first metallic material.

3. The semiconductor device of claim 2, wherein the patterned metal conductors of each of the first, second and third interconnect levels comprises the first metallic material.

4. The semiconductor device of claim 2, wherein the via is a skip-via.

5. The semiconductor device of claim 4, wherein the via includes at least a segment of the patterned metal conductor of the third interconnect level.

6. The semiconductor device of claim 2, wherein the first metallic material and the second metallic material comprise at least one of cobalt, titanium, copper, aluminum, tungsten, iridium, ruthenium, or alloys thereof.

7. The semiconductor device of claim 2, wherein the second metallic material comprises cobalt.

8. The semiconductor device of claim 1, including a third additional via disposed in the third interconnect level and extending between and electrically coupled with the patterned metal conductor of the second interconnect level.

9. The semiconductor device of claim 1, wherein the first interconnect level comprises a first dielectric layer and a first dielectric cap disposed on the first dielectric layer.

10. A semiconductor device, comprising:
a substrate:
a plurality of interconnect levels disposed on the substrate, the plurality of interconnect levels including at least a first interconnect level, a second interconnect level and a third interconnect level, each interconnect level having a patterned metal conductor;
a via spanning the second interconnect level and the third interconnect level, the via comprising a first via segment within the second interconnect level and a portion of the third interconnect level and a second via segment within a remaining portion of the third interconnect level, the first via segment comprising a first conductive material and the second via segment comprising a second conductive material different from the first conductive material;
a first additional via extending between and electrically coupled with the patterned metal conductors of the first and second interconnect levels; and
second and third additional vias extending between and each electrically coupled with other respective parts of the patterned metal conductor of the second interconnect level and the patterned metal conductor of the third interconnect level; and
wherein a top surface of the first via segment within the portion of the third interconnect level is above a bottom surface of the patterned metal conductor of the third interconnect level.

11. The semiconductor device of claim 10 wherein the first via segment is coupled to the patterned metal conductor of the first interconnect level and at least partially extends into the third interconnect level.

12. The semiconductor device of claim 11 wherein the via is a skip via.

13. The semiconductor device of claim 11, wherein the patterned metal conductor of the first interconnect level comprises the second conductive material.

14. The semiconductor device of claim 10, wherein the via comprising the first via segment and the second via segment is a monolithically formed via.

15. The semiconductor device of claim 10, wherein the first conductive material and the second conductive material comprise at least one of cobalt, titanium, copper, aluminum, tungsten, iridium, ruthenium, or alloys thereof.

16. The semiconductor device of claim 10, wherein the first interconnect level comprises a first dielectric layer and a first dielectric cap disposed on the first dielectric layer.

17. The semiconductor device of claim 16, wherein the second interconnect level comprises a second dielectric layer and a second dielectric cap disposed on the second dielectric layer.

18. The semiconductor device of claim 17, wherein the third interconnect level comprises a third dielectric layer.

19. The semiconductor device of claim 9, wherein the second interconnect level comprises a second dielectric layer and a second dielectric cap disposed on the second dielectric layer, and the third interconnect level comprises a third dielectric layer.

* * * * *